United States Patent
Hoffmeyer et al.

(10) Patent No.: US 6,499,215 B1
(45) Date of Patent: Dec. 31, 2002

(54) PROCESSING OF CIRCUIT BOARDS WITH PROTECTIVE, ADHESIVE-LESS COVERS ON AREA ARRAY BONDING SITES

(75) Inventors: Mark Kenneth Hoffmeyer, Rochester, MN (US); Daniel Scott Johnson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/606,583

(22) Filed: Jun. 29, 2000

(51) Int. Cl.[7] ................................................. H05K 3/34
(52) U.S. Cl. ............................ 29/840; 29/830; 29/832; 29/843; 174/260; 361/751
(58) Field of Search ......................... 29/840, 832, 850, 29/843, 830, 831; 228/254, 248.1, 224; 174/260, 250, 35 R; 361/751, 398; 257/678, 697; 439/66, 74

(56) References Cited

U.S. PATENT DOCUMENTS

| | | | |
|---|---|---|---|
| 4,390,220 A | | 6/1983 | Benasutti .................... 339/17 |
| 4,833,276 A | * | 5/1989 | Ito ............................. 174/35 R |
| 4,855,535 A | | 8/1989 | Pereyda ..................... 174/52.1 |
| 5,049,084 A | | 9/1991 | Bakke .......................... 439/66 |
| 5,099,392 A | | 3/1992 | Miller et al. ................ 361/400 |
| 5,311,402 A | * | 5/1994 | Kobayashi et al. ......... 361/760 |
| 5,400,949 A | * | 3/1995 | Hirvonen et al. ...... 228/180.22 |
| 5,413,489 A | * | 5/1995 | Switky ......................... 439/71 |
| 5,428,508 A | | 6/1995 | Pronto ........................ 361/818 |
| 5,434,357 A | | 7/1995 | Belcher et al. ............. 174/52.2 |
| 5,530,202 A | * | 6/1996 | Dais et al. ................. 174/35 R |
| 5,550,713 A | | 8/1996 | Pressler et al. ............. 361/818 |
| 5,742,488 A | | 4/1998 | Lonka et al. ............... 361/816 |
| 5,751,556 A | | 5/1998 | Butler et al. ................ 361/773 |
| 5,762,259 A | * | 6/1998 | Hubacher et al. ...... 228/180.22 |
| 5,907,478 A | | 5/1999 | Watanabe ................... 361/807 |
| 6,114,757 A | * | 9/2000 | DelPrete ..................... 257/678 |

(List continued on next page.)

FOREIGN PATENT DOCUMENTS

| JP | 3-14288 | * | 1/1991 |
|---|---|---|---|
| JP | 2001143828 | * | 5/2001 |

OTHER PUBLICATIONS

Memis, Irving et al., Enabling Grid Array Modules Through Advanced PWB Surface Finish, Advanced Packaging Technologies Tutorial, SEMICON West 99, (1999), pp. A–1 to A–7.

"Pin Location Outline Plate Fixture for Surface Mount Technology Screen Printers", *IBM Technical Disclosure Bulletin,* vol. 39, Pub. No. 5, (May 1996), 1 page.

"Selective Component Protector for Card Assembly Solder Process", *IBM Technical Disclosure Bulletin,* vol. 37, Pub. No. 5, (May 1994), 1 page.

(List continued on next page.)

*Primary Examiner*—Peter Vo
*Assistant Examiner*—Minh Trinh
(74) *Attorney, Agent, or Firm*—Wood, Herron & Evans

(57) ABSTRACT

A method for processing circuit boards containing area array surface treated bonding sites, such as noble metal terminal pads of a Land Grid Array (LGA) assembly. The circuit board includes a plurality of apertures patterned about the bonding site to form a footprint. A protective cover shaped to conform to the footprint includes posts registered to removably fit into the apertures. The protective cover remains overlaid on the circuit board during fabrication processes such as solder screen printing, rework, and washing, and then removed. Thus, contamination from the fabrication processes is avoided, as well as eliminating possible sources of contamination from use of adhesive tape for protection.

24 Claims, 7 Drawing Sheets

U.S. PATENT DOCUMENTS

| | | | |
|---|---|---|---|
| 6,144,557 A | | 11/2000 | Chen et al. ................. 361/704 |
| 6,158,650 A | * | 12/2000 | Hozmann ................ 228/248.1 |
| 6,164,636 A | * | 12/2000 | Taylor ........................ 269/287 |
| 6,178,097 B1 | * | 1/2001 | Haul, Jr. ..................... 361/816 |
| 6,191,480 B1 | * | 2/2001 | Kastberg et al. ............ 257/727 |
| 6,237,832 B1 | * | 5/2001 | Chung ....................... 228/44.7 |
| 6,339,210 B1 | | 1/2002 | Hembree et al. ........... 219/209 |
| 6,344,684 B1 | * | 2/2002 | Hussain et al. ............. 257/697 |
| 6,362,516 B1 | * | 3/2002 | Waters ....................... 257/678 |

OTHER PUBLICATIONS

"Localized Reflowing of Fusible Coatings", *IBM Technical Disclosure Bulletin,* Order/Fcode/Docket: 85A 61229 / 02–000 02–570 02–250 P22/EN8830631 (May 1985), 2 pages.

"Plating Mask Applique", *IBM Technical Disclosure Bulletin,* Order/Fcode/Docket: 85A 60442 / 02–035 02–030 P22 / EN8840228, (Mar. 1985), 1 page.

"Plastic Plating Mask", *IBM Technical Disclosure Bulletin,* Order/Fcode/Docket: 74C 00865 / 02–030. / PO8730132, (Mar. 1974), 2 pages.

* cited by examiner

PROCESSING OF CIRCUIT BOARDS WITH PROTECTIVE, ADHESIVE-LESS COVERS ON AREA ARRAY BONDING SITES

FIELD OF THE INVENTION

The invention is generally related to processing of printed circuit boards, and more particularly, to the processing of printed circuit boards that include an area array assembly, such as Land Grid Array (LGA).

BACKGROUND OF THE INVENTION

As silicon technology advances, there is a trend for higher density electrical interconnection of components on a circuit board or Printed Wiring Board (PWB). Increasingly, Pin Through Hole (PTH) attachment of electronic components is inadequate due to the limited number of interconnections possible thereby. The hole prevents overlaying separate conduction paths. In addition, practical dimensions of the holes and pins for inserting in the holes further limits PTH attachment to low density electronic components.

"Standard" Surface Mount Technology (SMT) is used often used when PTH is not applicable or not desired, such as when interconnecting components having lead pitches of approximately 50 mils (1.27 mm). Surface Mount Technology allows overlaying multiple conduction paths across a given point on the circuit board and can be used on both sides of the circuit board. Multiple SMT components are typically placed on an upward face of a circuit board prepared with solder paste printing. The leads of the SMT components are simultaneously attached through a mass reflow process where an infrared heat source melts the solder paste printing to electrically and mechanically attach the leads to the circuit board.

With more complex microprocessors and higher throughput Application Specific Integrated Circuits (ASIC), Fine Pitch Technology (FPT) interconnect components having peripheral leads having a pitch ranging from about 20–40 mils (0.5–1.0 mm) are used. FPT is based on 50 mil standard SMT production, but with minor changes and tighter process controls.

Ultra-Fine Pitch Technology (UFPT) enables interconnection of components having hundreds of peripheral leads with lead pitches of about 0.5 mm (20 mils) or less. For higher lead counts ranging from hundreds to thousands of leads, area array packaging techniques are used, and are characterized as having a group of connection elements, such as solder bumps or alternate interconnect pads arranged as rows and columns beneath a component package body.

For solderable array packages, such as Ball Grid Array (BGA) and micro-BGA area integrated circuit packages, the input and output points are solder balls arranged in a grid pattern on the underside of the component. However, cyclic temperature variations in applications can pose solder fatigue reliability problems to the ball solder connections. Interconnections with less sensitivity to cyclic temperature fatigue include Column Grid Array (CGA) in which solder columns are used rather than solder balls.

Land Grid Arrays (LGA) are often used for high lead count packaging that have interconnection requirements where solder connection cannot provide adequate reliability. LGA is also often used when a capability is desired for readily replacing a component or modules onto the circuit board without costly and time consuming solder repair and assembly processes, thus enhancing the repairability and upgradeability of a circuit board. Land Grid Arrays (LGA) are integrated circuit (IC) packages (e.g., an LGA socket) in which conductive bumps in an array are mechanically held without the use of solder by an LGA interposer to corresponding conductive terminal pads that form the bonding site on the circuit board. Consequently, the LGA packaging is not subjected to the temperature expansion of BGA and CGA packaging during reflow and thus finer lead pitches are achievable.

Area array packages drive different requirements on the circuit board for surface finish and assembly, unlike PTH and standard SMT packages. For example, Ball Grid Array (BGA), Column Grid Array (CGA), and Land Grid Array (LGA) each have a requirement for coplanarity of bonding sites not necessarily accommodated by generally used solderable surfaces. Moreover, depending on the type of array packaging used, surface treatment of the bonding site on the circuit board, such as by Organic Surface Preparation (OSP) or gold plating, is required to ensure interconnection reliability of LGA termination. Specifically, to ensure LGA interconnection reliability, LGA surface treatment of the circuit board must include noble metal plated (e.g., gold/nickel) terminal pads at the bonding site.

Area array surface finish treatments should be kept free of contaminants to ensure reliable electrical interconnection of the attached area array component, such as an LGA socket. Since a circuit board may include other components assembled by PTH attachment and standard SMT and FPT, keeping the surface finish clean and free of contaminants may be difficult due to the number of circuit board fabrication processes that may occur between the time that the surface finish is applied and the area array components are affixed to the circuit board. These bonding sites are thus subject to contamination during PWB fabrication, including presence of resist or mask residues. These bonding sites are further subject to contamination during, assembly including presence of flux residues, solder transfer, and various adherent or semi-adherent organic and inorganic residues transferred to the bonding site during all phases of circuit board handling, assembly, test and repair operations. Avoiding contamination is particularly significant for an LGA assembly where an LGA interposer presses the LGA component into electrical contact with the surface treated bonding site, rather than having a solder contact wherein the melting of the solder may overcome surface contaminants. The LGA interposer grips the circuit board and self aligns to the bond site through apertures in the circuit board.

Conventionally, area array bonding sites have been protected during various processing steps through the temporary application of an adhesive film, e.g., a KAPTON® tape having a silicone-based adhesive available from Du Pont. However, protection of the bonding sites with tape masking may introduce a source of contamination when a portion of the tape, or the adhesive residue from the tape, remains on the bonding site.

Residue from adhesive tape may entrap fluids during processing of the circuit board, such as during cleaning. Also, residue may encourage condensation and retention of water thereafter. The tape residue itself, or contaminants entrapped during processing of the circuit board, may also detrimentally chemically react with the circuit board. For example, presence of contamination on the surface treatment can create conditions for both electrochemical corrosion and metal migration allowing for either oxidized, insulating layers to form on a bonding site, or growth of conductive metal filaments between separate interconnection paths. Applications and removal of adhesive tape can also cause slivers of metal to be dislodged on the circuit board, such as removing and redepositing gold LGA terminal pads from the bonding site.

Therefore, aggregate contaminations can create either open circuits between an area array contact and a bonding site, or short circuits across adjacent contacts. The defects may be immediate, or dependent on factors such as temperature, frequency of a signal utilizing the contact, humidity, vibration, etc., and thus be intermittent. The defects may also be latent, such as a contaminant that oxidizes over time becoming insulating.

In addition to potential for generation of LGA contact defects, a masking process is constrained by the time required to place and remove the tape, as well as additional steps of inspection and test required to verify correct removal, thus increasing production costs.

Consequently, a significant need exists for protecting area array surface treated bonding sites during assembly processing of a printed circuit board.

SUMMARY OF THE INVENTION

The invention addresses these and other problems associated with the prior art by providing an apparatus and method of protectively covering a bonding site on a circuit board during processing using a combination of a protective cover and a plurality of posts that engage and align the cover over an area array bonding site of a printed circuit board.

In many embodiments, adhesive is not required to effectively retain the protective cover in position over the bonding site. Thus, the protective cover does not leave residue on the bonding surface like tape or film that are prone to failure during removal, especially with the increased removal forces required to overcome the adhesive. Consequently, the protective cover does not become a source of contamination to the bonding site from residue of the adhesive or a failed portion of the protective cover.

Consistent with one aspect of the invention, a method for processing a circuit board having an area array bonding site includes overlaying a protective cover over the bonding site by registering a plurality of posts secured to one of the protective cover and the circuit board into a plurality of apertures disposed in the other of the protective cover and the circuit board. With the protective cover overlaid on the circuit board, various fabrication processes may then be performed and then the protective cover is removed.

Consistent with an additional aspect of the invention, an assembly of a circuit board having an area array bonding site on a surface of the circuit board is overlaid by a protective cover. The protective cover is removably registered to the bonding site by a plurality of posts secured to one of the protective cover and the circuit board into a plurality of apertures disposed in the other of the protective cover and the circuit board.

Consistent with another aspect of the invention, a method of fabricating a protective cover and an assembly of the protective cover and circuit board is described. The circuit board has a plurality of apertures forming a footprint encompassing an area array bonding site on a surface of the circuit board. Base material is sized for the footprint and a plurality of posts are bonded to the base material in a pattern corresponding to the footprint to form the protective cover.

Consistent with yet another aspect of the invention, a cover has a base member shaped to at least correspond to an area array bonding site on a surface of a circuit board. The cover has a plurality of posts coupled to a face and registered for a plurality of apertures on the circuit board.

These and other advantages and features, which characterize the invention, are set forth in the claims annexed hereto and forming a further part hereof However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
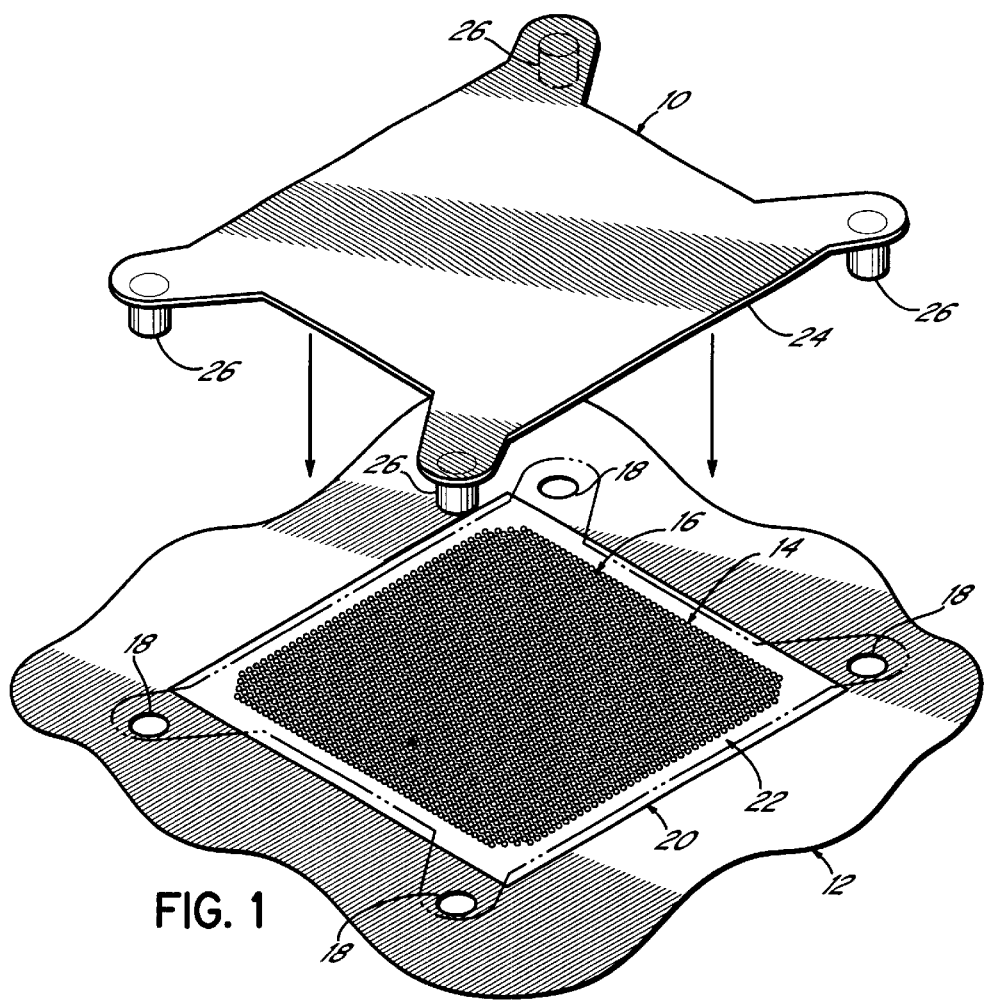
FIG. 1 is an exploded perspective view of a protective cover and a portion of a circuit board having an area array bonding site and a plurality of apertures.
Figure 2:
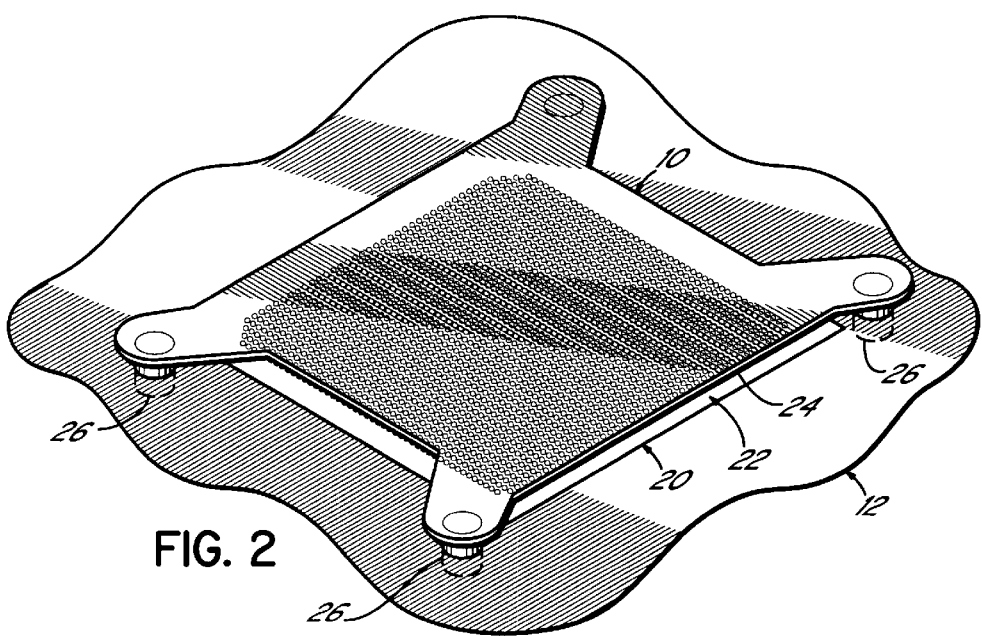
FIG. 2 is a perspective view of the protective cover overlaying the circuit board of FIG. 1.

Turning to the Drawings, wherein like numbers denote like parts throughout the several views, FIGS. 1 and 2 illustrate a protective cover 10 consistent with the invention for protecting a portion of a circuit board 12 having an area array surface treated bonding site 14. The bonding site 14 includes a plurality of Land Grid Array (LGA) pad terminations 16 having a surface finish of noble metal, such as gold/nickel (Au/Ni) plating.

Patterned about the bonding site 14 are a plurality of apertures 18 forming a footprint 20 that encompasses the bonding site 14 with a margin 22. The margin is selected to be suitably broad to prevent contaminants from reaching the outermost pad terminations 16 while not unduly reducing the portion of the circuit board 12 available for processing.

It is consistent with aspects of the invention that the apertures 18 are also intended for attaching area array components (e.g., LGA sockets) to the bonding site 14 at a later stage of processing of the circuit board 12. In other embodiments, however, the apertures may be provided solely for usage with a protective cover.

The cover 10 is formed from sheet base material 24 shaped to correspond to the footprint 20. The base material 24 is selected as being resistant to the processing of the circuit board 12 and to not be a source of contamination to the bonding site 14. An example of base material is FR4 glass epoxy laminate, whereby shaping may be readily achieved by mechanically punching or laser cutting the base material.

A plurality of posts 26 are registered on the base material 24 to correspond to the pattern of apertures 18 on the circuit board 12. As an example, stainless steel posts of about 0.125" (3.175 mm) diameter and about 0.080" (2.03 mm) height that are undersized about 0.010–0.015" (0.254–0.381 mm) with respect to the corresponding apertures 18 provide precise lateral placement of the cover 10, and also removal by tipping the circuit board 12. A cover 10 that nonetheless resists falling from the circuit board 12 may be readily released by prodding the end of a post 26 from the opposite side of the circuit board 12 through the aperture 18 with a small tool such as Electro-Static Discharge (ESD) solder assist tool, a small wood dowel from a cotton swab, or equivalent device.

The thickness of the base material 24 is advantageously about 0.006–0.008" (0.152–0.203 mm) for implementations where a custom stencil (not shown) is used in subsequent processing, described below with regard to FIG. 7. The custom thick solder screen print stencil of about overall thickness 0.0060–0.0075" (0.152–0.191 mm) may advantageously include an about 0.003" (0.076 mm) relief depth protective cover pocket registered on a contact surface to nest over the cover 10. Thus, solder screen print deposits such as a decoupling capacitor site on portions of the circuit board 12 as close as about 0.100" (2.54 mm) to the bonding site 14 (not shown) are not affected by the cover 10. Some flexure of the stencil will occur when a squeegee wipes excess solder from the stencil due to the cover 10.

For applications where screen printing is not contemplated (e.g., wave solder, rework), thicker protective covers 10 may be used, such as about 0.020 inches (0.508 mm) in thickness.

Although an LGA bonding site 14 is depicted in FIGS. 1 and 2, it should be apparent to those skilled in the art having the benefit of the instant disclosure that the protective cover 10 may have a footprint 20 that covers a plurality of bonding sites 14. In addition, one protective cover 10 may be applied to other area array electronic circuit interconnection and packaging technologies, as well as other surface treatments on circuit boards 12.

The plurality of posts 26 and apertures 18 may be reversed with the posts attached to the circuit board 12 and the apertures made into the cover 10. Furthermore, for applications where a plurality of different shaped bonding sites 14 are contemplated, a plurality of dissimilar footprints 20 may be designed whereby a unique pattern of apertures 18 and/or unique shape of posts 26 and apertures 18 enable a keyed cover 12 to prevent misapplication.

Figure 3:
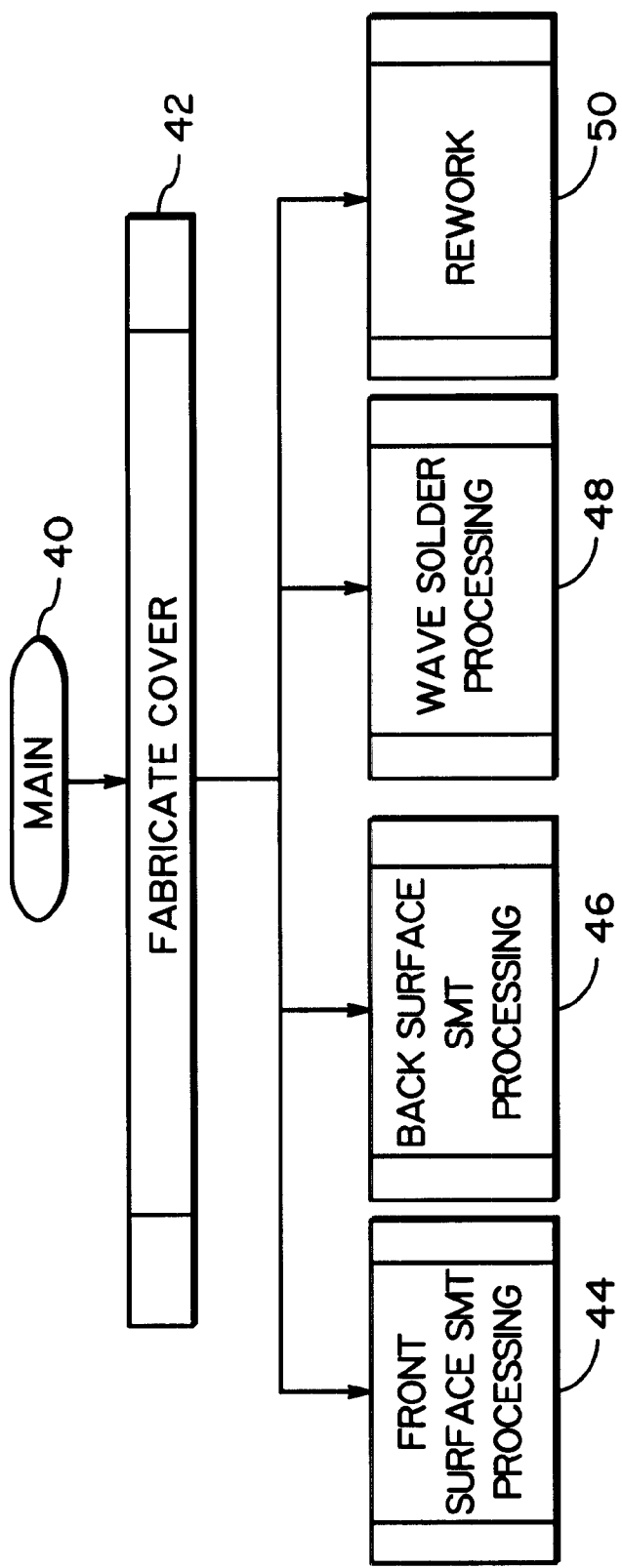
FIG. 3 is a flowchart illustrating a top-level main procedure for processing a circuit board consistent with the invention.

To illustrate the uses of the protective cover 10, FIG. 3 depicts a top-level main process 40 for processing a circuit board 12. Main process 40 begins with the circuit board fabricated to a point where it contains the bonding site 14 and the apertures 18.

A cover 10 is made available by a fabricate cover procedure (block 42). Depending upon the types of electronic interconnection and packaging to be implemented on the circuit board, a number of processes are performed. Main procedure 40 illustrates four procedures: front surface SMT processing (block 44), back surface SMT processing (block 46), wave solder processing (block 48), and rework (block 50). It will be appreciated that other processing steps, which may or may not require the use of a protective cover, may also be performed during manufacture of a printed circuit assembly consistent with the invention.

Figure 4:
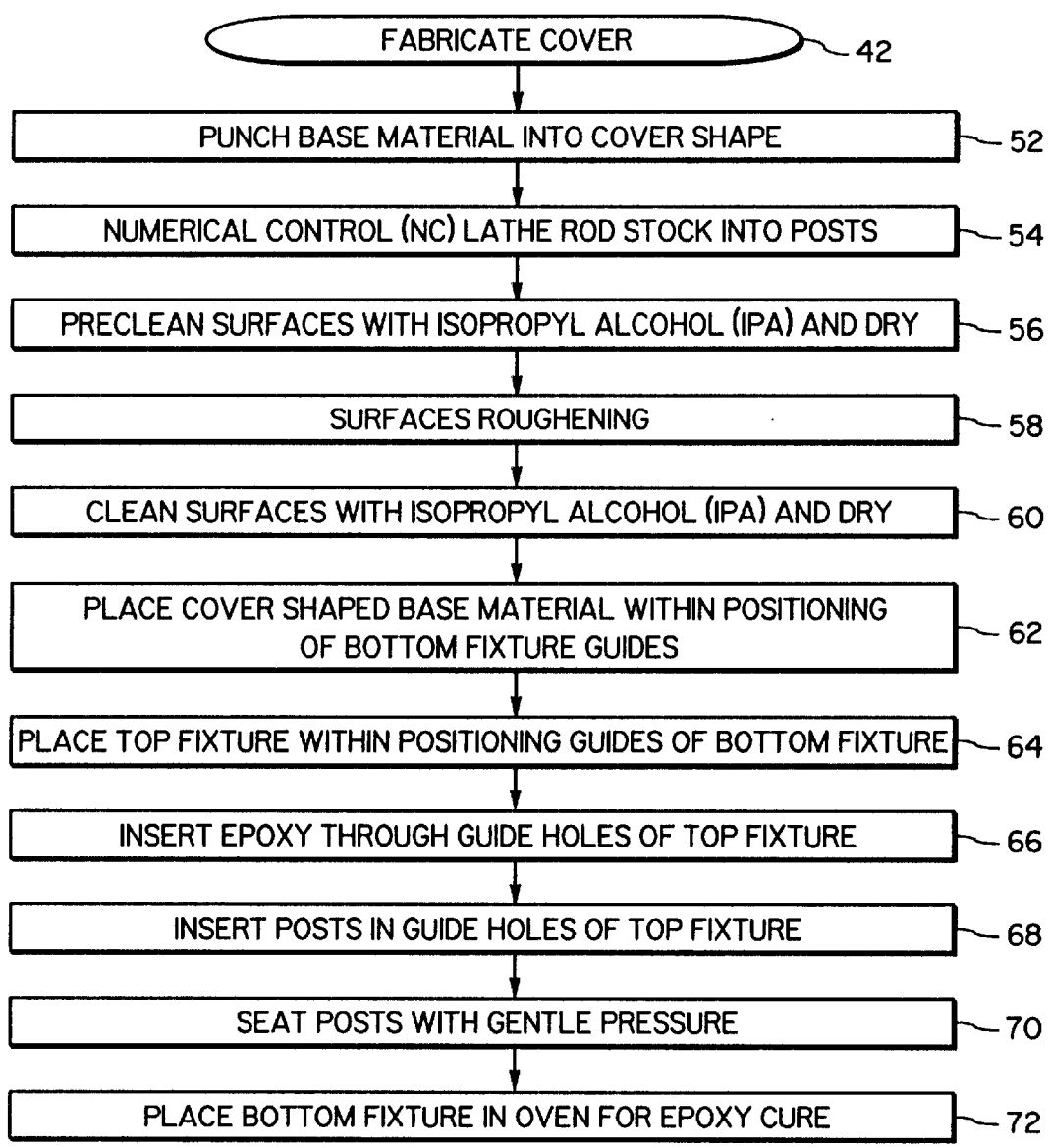
FIG. 4 is flowchart illustrating the fabricate cover procedure referenced in FIG. 3.

FIG. 4 is flowchart illustrating the fabricate cover procedure 44 referenced in FIG. 3. The base material is punched into a predetermined cover shape (block 52). The plurality of posts are cut from stainless steel rod stock by a numerically controlled lathe to the appropriate length (block 54). Surfaces of the posts and base material that are to be bonded are pre-cleaned with isopropyl alcohol and allowed to dry (block 56). Pre-cleaning advantageously removes contaminants that otherwise may be driven into the base material when sanded. The bond surfaces of both posts 26 and base material 24 are roughened using 400 gauge sandpaper, tumbling, sandblasting, or suitable chemical roughening treatment (block 58). Any remaining residue is removed by cleaning the surfaces again with isopropyl alcohol and the posts 26 and base material 24 are allowed to dry (block 60). Cleaning after roughening removes contaminants that could impair the bonding of posts to the base material and/or contaminate circuit board.

The cover shaped base material is then placed onto a first, bottom fixture within a plurality of positioning guides that laterally position the base material to a predetermined location (block 62). A second, top fixture is placed on top of the cover shaped base material, with the positioning guides of the first, bottom fixture also positioning the second, top fixture to the predetermined location (block 64). The top fixture has a plurality of guide holes corresponding to the pattern of apertures on the intended circuit board. A chip under fill epoxy adhesive, such as HYSOL 4526, is applied to the prepared surfaces of the base material with a 5–10 cc syringe having a 23-gauge needle inserted through each guide hole of the top fixture (block 66). This adhesive provides good adhesion to both the metal post and base material. Then, each post is inserted into a guide hole, with the roughened surface of each post going in first (block 68), and seated with gentle pressure (block 70). The bottom fixture, bearing the base material, posts, and top fixture, is placed into an oven for epoxy cure at 160° C. for 20 minutes (block 72).

Figure 5:
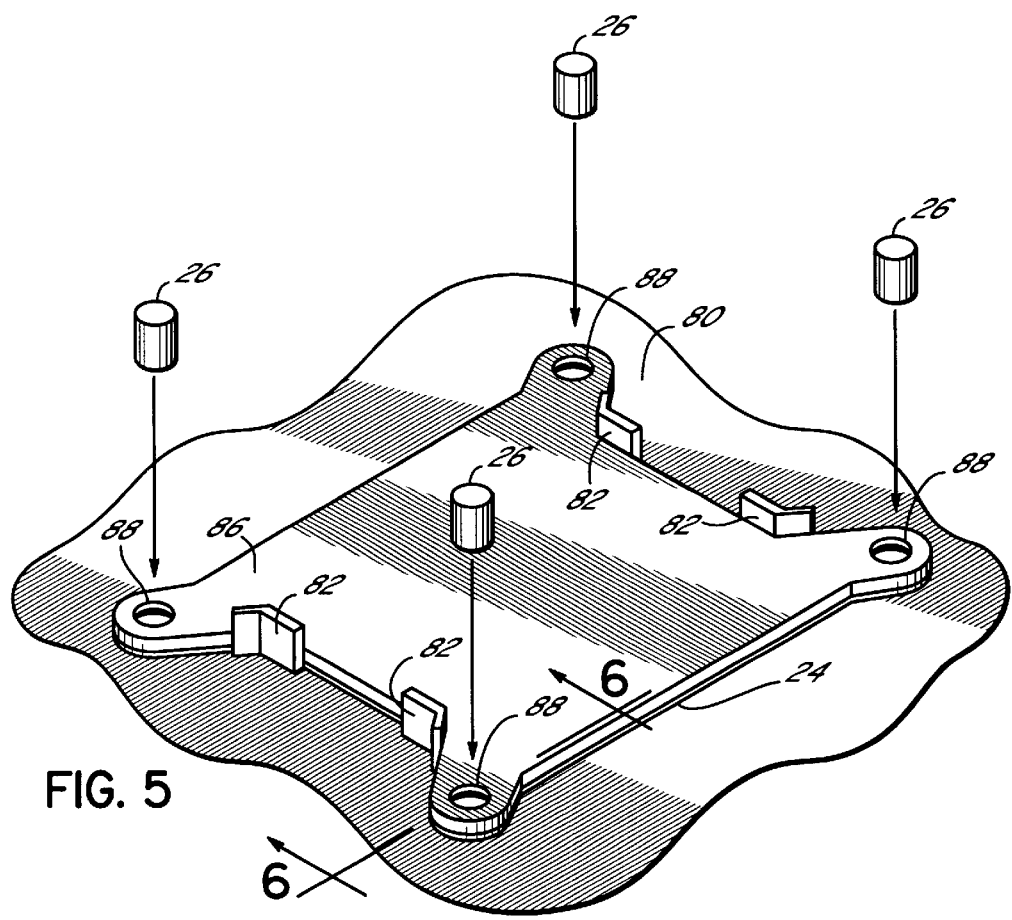
FIG. 5 is an exploded perspective view of a plurality of posts being registered by a top and bottom fixture to locations on cover shaped base material to form the protective cover of FIGS. 1 and 2.

As an illustrative example of the fabricate cover procedure 42 as of block 66 of FIG. 4, FIG. 5 is a perspective view of a bottom fixture 80 having a plurality of lateral positioning guides 82. On top of the bottom fixture 80, base material 24 resides between the lateral positioning guides 82. On top of the base material 24, a top fixture 86 also resides between the lateral positioning guides 82. The top fixture has a plurality of guide holes 88 for positioning the pins 26 on top of the base material 24 to form a protective cover 10 of FIGS. 1 and 2.

Figure 6:
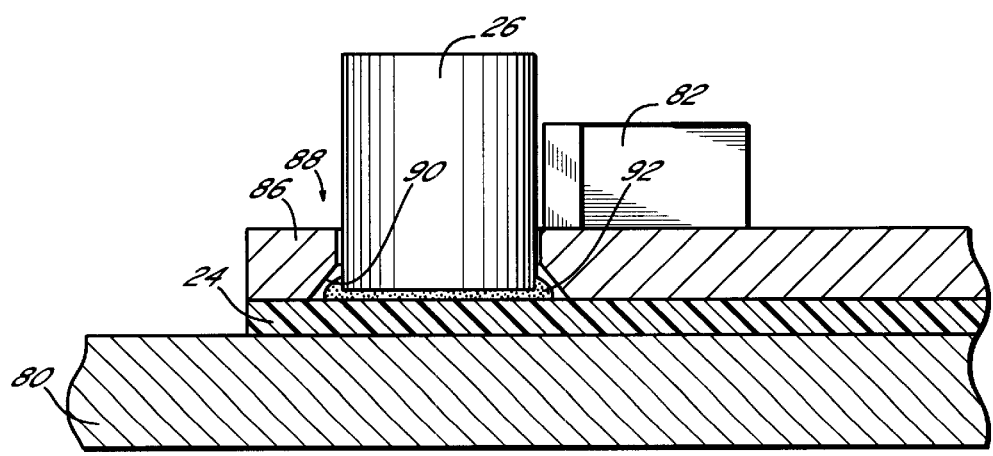
FIG. 6 is cross-sectional side view along line 6—6 of FIG. 5, depicting one of the plurality of posts positioned by the fixtures and bonded to the base material.

FIG. 6 is cross-sectional side view along of FIG. 5, depicting one of the plurality of posts 26 positioned by the fixtures 80, 86 and bonded to the base material 24. The guide hole 88 advantageously includes a countersunk beveled surface 90 in abutting relation to the base material 24 so that a bead 92 of bonding agent may form around the base of the post 26 for stronger attachment and to prevent inadvertent attachment to the top fixture 86.

It should be appreciated that consistent with the invention, the bottom fixture 80 may be designed to accommodate a number of covers. Moreover, the top fixture 86 may also have a provisions for guide holes 88 for a plurality of cover shaped base material 24. Furthermore, it would be apparent to those skilled in the art having the benefit of the instant disclosure that various adhesives may be used and that non-heat curved adhesives may be used.

Figure 7:
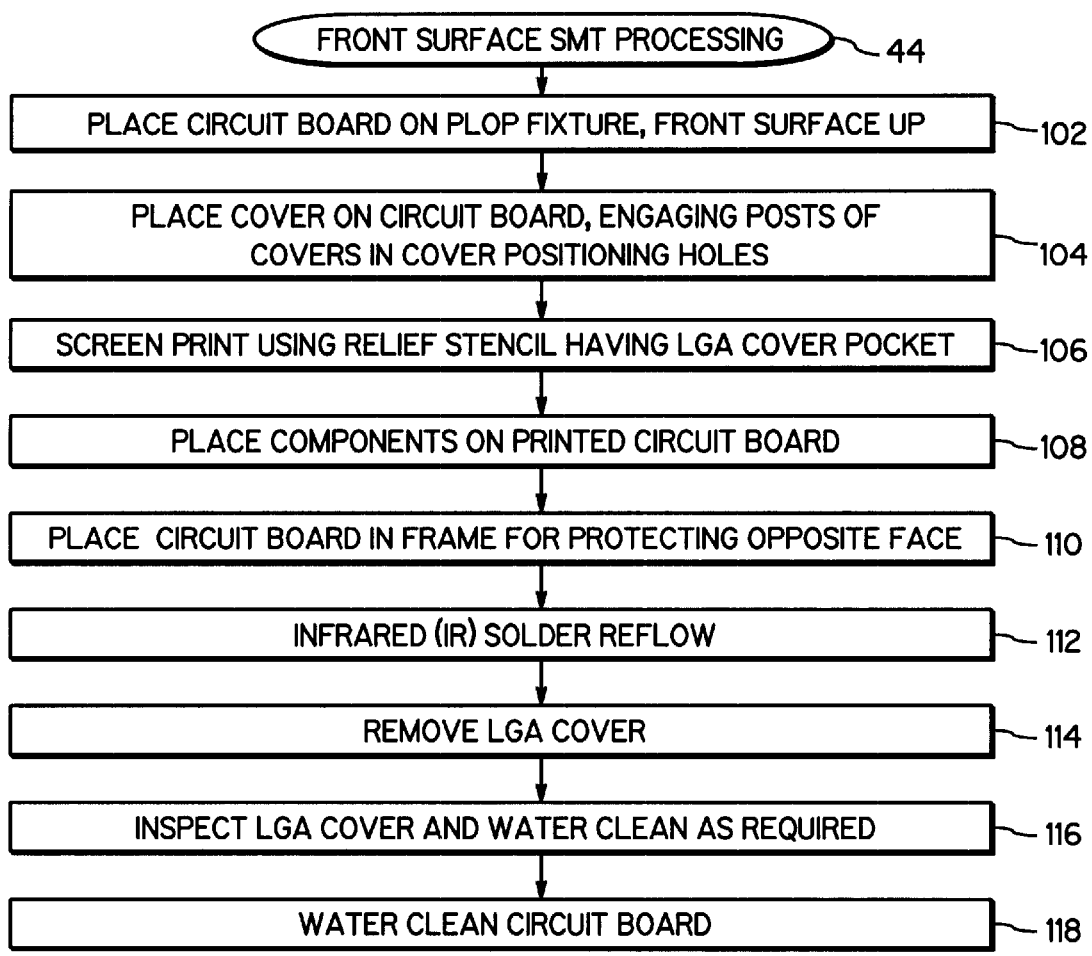
FIG. 7 is a front surface SMT processing procedure referenced in FIG. 3.

FIG. 7 illustrates the front surface SMT processing procedure 44 referenced in FIG. 3 consistent with the invention, as an example of processing a circuit board 12 having a bonding site 14 protected by a cover 10.

It is contemplated that a design of a Pin Location Outline Plate (PLOP) fixture for a double-sided SMT screen printer would take into consideration the location of a bonding site 14. For a cover intended to fall away when the circuit board 12 is tipped, the bonding site 14 is exposed when downwardly positioned, and thus, all posts (not shown) on a PLOP fixture should be designed to avoid the bonding site 14.

Thus, procedure 44 begins with placing the circuit board onto a PLOP fixture to protect features on the back side (block 102). Single-sided circuit boards 12 may be supported in other apparent manners. Also, for double sided SMT circuit boards 12, a similar SMT processing procedure 46 may be performed in a manner similar to that described in FIG. 7 for the back surface SMT processing procedure referenced in FIG. 3, with the back surface up rather than the front surface.

Screen print using a relief stencil, such as the custom stencil described above, allows for solder screen printing with the protective cover 10 installed on the circuit board 12 (block 106). The Surface Mount Technology (SMT) components are placed on the printed circuit board (block 108). The circuit board is placed in a green glass support window frame for protecting the opposite face, such as from the oven belts or chains (block 110). The circuit board then undergoes infra red (IR) solder reflow to attach the SMT components (block 112). The protective cover is then removed from the circuit board (block 114) and inspected and water cleaned as required (block 116). Then the circuit board is water cleaned (block 118).

It should be appreciated that with appropriate selection of base material that cleaning requirements may be minimal. In addition, cleaning the protective cover would be unnecessary for applications where the protective cover is used once and disposed. If cleaning is applicable, a fixture shaped to hold one or more covers may advantageously position the cover during water wash cleaning and position for uniform drying.

Figure 8:
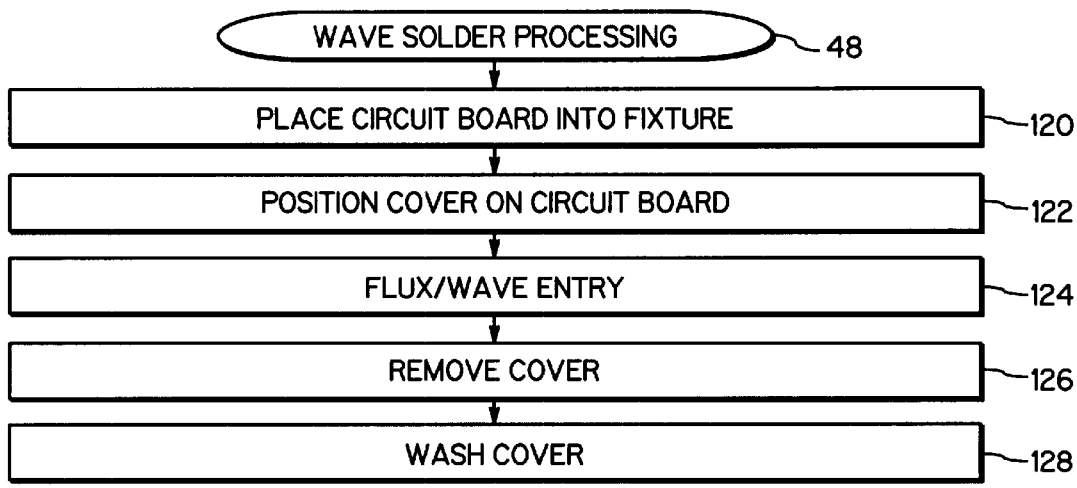
FIG. 8 is a wave solder processing procedure referenced in FIG. 3.

FIG. 8 is the wave solder processing procedure 48 referenced in FIG. 3. For embodiments of the invention where the protective cover 10 is removed by tipping the circuit board 12, the circuit board 12 may be placed into a fixture for keeping another, downward facing bonding site from contacting a surface or other object during handling (block 120). The protective cover 10 is positioned on the circuit board 12, although the cover 10 may already be on the circuit board 12 at this point (block 122). Then the circuit board 12 undergoes solder flux/wave entry (block 124). The protective cover 10 is removed (block 126) and typically water washed after each exposure to the wave solder process (block 128).

Figure 9:
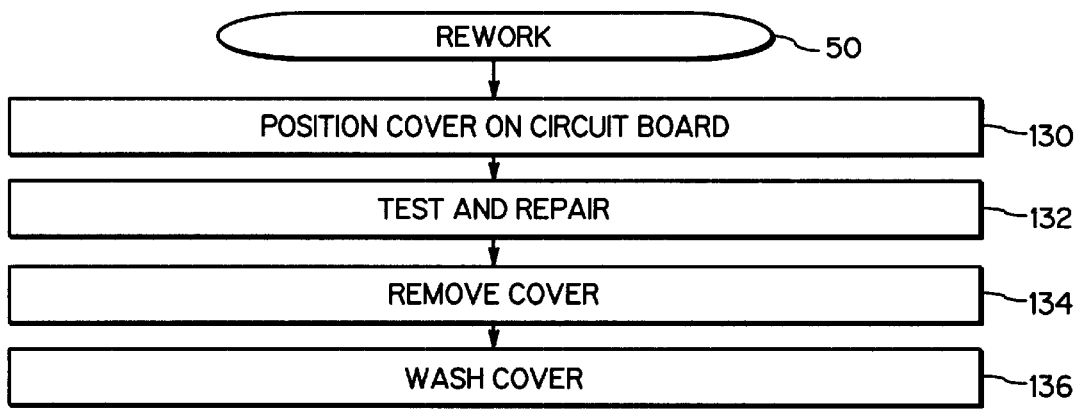
FIG. 9 is a rework procedure referenced in FIG. 3.

FIG. 9 is a rework procedure 50 referenced in FIG. 3. The protective cover 10 is positioned on the circuit board 130, if not already present (block 130). The test and repair processing occurs (block 132). Then the cover 10 is removed (block 134) and washed as required (block 136). The type and frequency of washing requirements depend on the type of rework being performed.

Figure 10:
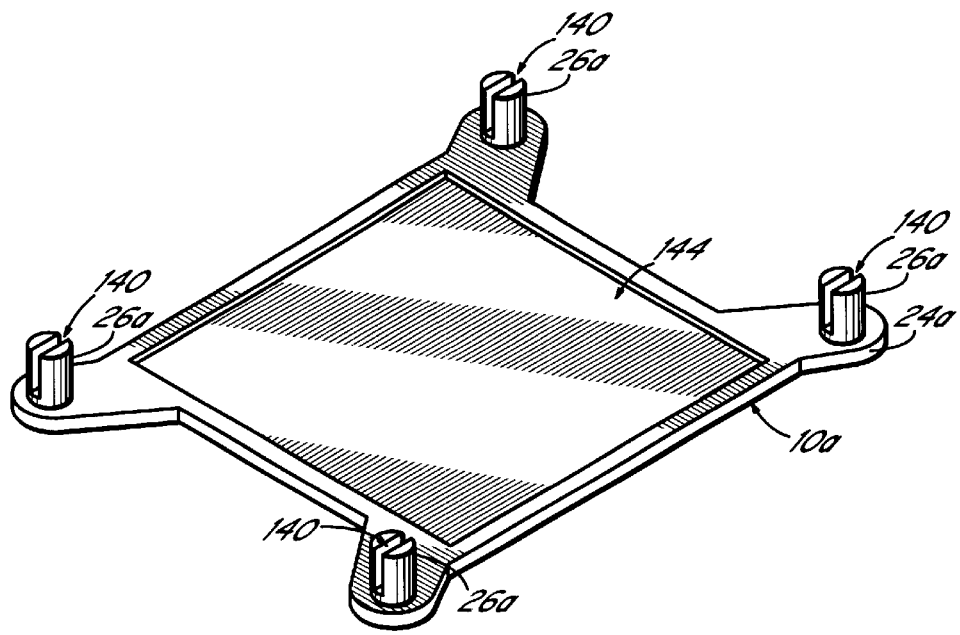
FIG. 10 is a bottom perspective view of a molded protective cover.
Figure 11:
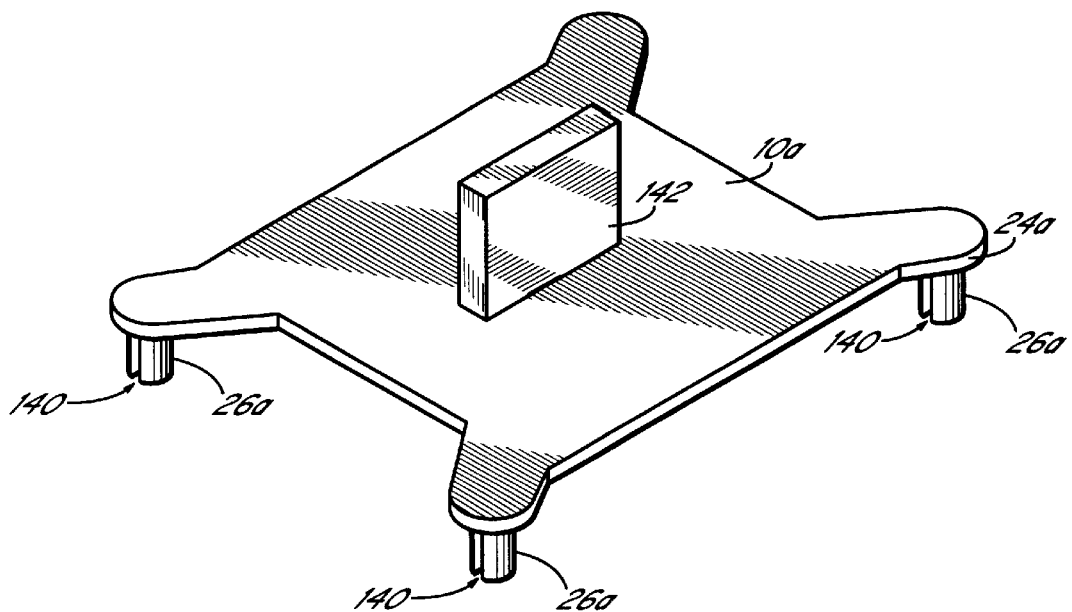
FIG. 11 is a top perspective view of the molded protective cover of FIG. 10.

FIGS. 10 and 11 depict another illustrative protective cover 10a formed from molded base material 24a that includes a plurality of molded posts 26a. Cover 10a may be advantageously thicker to allow use of various base materials 24a, especially when the cover 10a need not be used with a solder screen printer. The molded base material 24a may advantageously contain conductive filler material, such as carbon, to provide protection from electrostatic discharge.

The protective cover 10a illustrates posts 26a that are inserted into apertures 18 of a circuit board 12 with an interference fit, resistant to removal by tipping the circuit board 12. The interference fit is enhanced by forming a diametral slot 140 longitudinally along each post 26a, allowing expansion of the diameter of each post 26a to engage each respective aperture 18. Thus, the protective cover 10a may remain on the circuit board to continue protecting the bonding site 14 when processing proceeds on the other side of the circuit board 12 from the bonding site 14.

Removal of the protective cover 10 may be accomplished by prodding the exposed end of the posts 26a through the apertures 18 in the circuit board 12, perhaps with the assistance of a removal tool with extensions sized and positioned to contact a plurality of the exposed ends of the posts 26a at the same time when pushing from the opposite side of the circuit board 12.

Alternatively, the protective cover 1a may include a graspable extension 142 from the exposed side of the base material 24, especially for applications where a stencil is not used or cannot be used over the protective cover 10 during processing. See FIG. 11.

With reference to FIG. 10, a recess 144 corresponding to the bonding site 14 on a circuit board 12 allows for further protection by eliminating cover contact with the bonding sites 14 and also provides better sealing when bonding sites 14 having a nonflat contour are present. For example, a recess of about 0.003" (0.08 mm) may be provided in base material 24a having an overall thickness of 0.015–0.020" (0.38–0.51 mm).

The cover 10a may advantageously remain on the circuit board 12 for extended periods of time, such as during shipment between fabrication processing steps. Moreover, fabrication processing may further entail upgrading of a fielded circuit board 12 after an extended period of time. Consequently, a cover 10a may remain on the circuit board 12 until removed for placement of an additional array component on the bonding site 14.

Other modifications will be apparent to one of ordinary skill in the art given the benefit of the instant disclosure. For example, the processing procures described herein and the individual actions and their sequence would depend upon the application. Various additional circuit board processing procedures would advantageously benefit from use of protective covers 10.

What is claimed is:

1. A method for processing a circuit board, the circuit board including an exposed area array bonding site, the method comprising:
   overlaying a protective cover over the bonding site by registering a plurality of posts secured to one of the protective cover and the circuit board into a plurality of apertures disposed in the other of the protective cover and the circuit board;
   performing a fabrication process on the circuit board while the protective cover is overlaid on the circuit board wherein the protective cover protects the bonding site from contamination associated with the fabrication, and
   removing the protective cover.

2. The method of claim 1, wherein overlaying the protective cover over the bonding sites comprises an adhesiveless contact between the protective cover and the bonding site.

3. The method of claim 1, wherein the fabrication process comprises:
   overlaying a stencil on the circuit board, the stencil including a protective cover pocket registered to the protective cover on the circuit board;

screen printing the circuit board; and removing the stencil.

4. The method of claim 1, wherein performing the fabrication process includes:

placing the circuit board into a wave soldering fixture; and performing wave soldering on the circuit board.

5. The method of claim 1, wherein performing the fabrication process is preceded by placing the circuit board in a frame, the frame operable to support an opposite face of the circuit board.

6. The method of claim 1, wherein performing the fabrication process includes:

placing a surface mount technology (SMT) component on the circuit board; and performing infra-red (IR) solder reflow on the circuit board.

7. The method of claim 1, wherein performing the fabrication process includes reworking the circuit board.

8. The method of claim 1, wherein removing the protective cover includes tipping the circuit board.

9. The method of claim 1, wherein the circuit board includes the plurality of apertures, the apertures passing through the circuit board, and the protective cover includes the plurality of posts, wherein removing the protective cover includes pushing one of the plurality posts through the corresponding one of the plurality of apertures.

10. The method of claim 1, wherein the area array bonding site comprises a plurality of land grid array terminal pads.

11. A method for processing a circuit board, the circuit board including an area array bonding site, the method comprising:

overlaying a protective cover over the bonding site, to provide an adhesiveless contact between the protective cover and the bonding site, by registering a plurality of posts secured to one of the protective cover and the circuit board into a plurality of apertures disposed in the other of the protective cover and the circuit board;

performing a fabrication process on the circuit board while the protective cover is overlaid on the circuit board wherein the protective cover protects the bonding site from contamination associated with the fabrication; and removing the protective cover.

12. The method of claim 11, wherein the fabrication process comprises:

overlaying a stencil on the circuit board, the stencil including a protective cover pocket registered to the protective cover on the circuit board;

screen printing the circuit board; and removing the stencil.

13. The method of claim 11, wherein performing the fabrication process includes:

placing the circuit board into a wave soldering fixture; and performing wave soldering on the circuit board.

14. The method of claim 11, wherein performing the fabrication process is preceded by placing the circuit board in a frame, the frame operable to support an opposite face of the circuit board.

15. The method of claim 11, wherein performing the fabrication process includes:

placing a surface mount technology (SMT) component on the circuit board; and performing infra-red (IR) solder reflow on the circuit board.

16. The method of claim 11, wherein performing the fabrication process includes reworking the circuit board.

17. The method of claim 11, wherein removing the protective cover includes tipping the circuit board.

18. The method of claim 11, wherein the circuit board includes the plurality of apertures, the apertures passing through the circuit board, and the protective cover includes the plurality of posts, wherein removing the protective cover includes pushing one of the plurality posts through the corresponding one of the plurality of apertures.

19. The method of claim 11, wherein the area array bonding site comprises a plurality of land grid array terminal pads.

20. A method for processing a circuit board, the circuit board including an area array bonding site, the method comprising:

overlaying a protective cover over the bonding site by registering a plurality of posts secured to one of the protective cover and the circuit board into a plurality of apertures disposed in the other of the protective cover and the circuit board;

performing a fabrication process on the circuit board while the protective cover is overlaid on the circuit board by overlaying a stencil on the circuit board, the stencil including a protective cover pocket registered to the protective cover on the circuit board, screen printing the circuit board, and removing the stencil; and removing the protective cover.

21. The method of claim 20, wherein overlaying the protective cover over the bonding sites comprises an adhesiveless contact between the protective cover and the bonding site.

22. The method of claim 20, wherein removing the protective cover includes tipping the circuit board.

23. The method of claim 20, wherein the circuit board includes the plurality of apertures, the apertures passing through the circuit board, and the protective cover includes the plurality of posts, wherein removing the protective cover includes pushing one of the plurality posts through the corresponding one of the plurality of apertures.

24. The method of claim 20, wherein the area array bonding site comprises a plurality of land grid array terminal pads.

* * * * *

UNITED STATES PATENT AND TRADEMARK OFFICE
CERTIFICATE OF CORRECTION

PATENT NO.    : 6,499,215 B1  
DATED         : December 31, 2002  
INVENTOR(S)   : Mark Kenneth Hoffmeyer et al.

It is certified that error appears in the above-identified patent and that said Letters Patent is hereby corrected as shown below:

Column 8,  
Line 53, before "performing" insert -- after overlaying the protective cover over the bonding site, --  
Line 56, "fabrication," should read -- fabrication process; --

Column 9,  
Line 42, before "performing" insert -- after overlaying the protective cover over the bonding site, --  
Line 45, "fabrication," should read -- fabrication process; --

Signed and Sealed this

Twenty-seventh Day of May, 2003

JAMES E. ROGAN  
*Director of the United States Patent and Trademark Office*